United States Patent
Gardner et al.

(10) Patent No.: US 10,704,258 B2
(45) Date of Patent: Jul. 7, 2020

(54) EXPANDABLE DATA CENTER WITH MOVABLE WALL

(71) Applicant: Amazon Technologies, Inc., Seattle, WA (US)

(72) Inventors: Brock Robert Gardner, Seattle, WA (US); Michael Phillip Czamara, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/042,959

(22) Filed: Jul. 23, 2018

(65) Prior Publication Data

US 2018/0328032 A1 Nov. 15, 2018

Related U.S. Application Data

(63) Continuation of application No. 15/231,630, filed on Aug. 8, 2016, now Pat. No. 10,030,383, which is a
(Continued)

(51) Int. Cl.
*E04B 2/74* (2006.01)
*H05K 7/14* (2006.01)
*H05K 7/20* (2006.01)
*E04B 1/343* (2006.01)
*E04B 1/66* (2006.01)
(Continued)

(52) U.S. Cl.
CPC ........ *E04B 2/7407* (2013.01); *E04B 1/34384* (2013.01); *E04B 1/66* (2013.01); *E04H 1/00* (2013.01); *E04H 5/00* (2013.01); *H05K 7/1497* (2013.01); *H05K 7/20745* (2013.01); *E04H 2005/005* (2013.01)

(58) Field of Classification Search
CPC ...... E04B 2/7407; E04B 1/34384; E04B 1/66; E04H 1/00; E04H 5/00; E04H 2005/005; E04H 4/082; H05K 7/20745; H05K 7/1497
USPC ............................................................ 52/63
See application file for complete search history.

(56) References Cited

U.S. PATENT DOCUMENTS

| 1,896,433 A | * 2/1933 | Windeknecht ...... E04B 1/34305 52/67 |
| 2,901,282 A | 8/1959 | Meaker |

(Continued)

FOREIGN PATENT DOCUMENTS

| CN | 2548392 | 4/2003 |
| CN | 101501599 | 8/2009 |

(Continued)

OTHER PUBLICATIONS

U.S. Appl. No. 14/486,763, filed Sep. 15, 2014, Brock Robert Gardner, et al.
(Continued)

*Primary Examiner* — Adriana Figueroa
(74) *Attorney, Agent, or Firm* — Robert C. Kowert; Kowert, Hood, Muyon, Rankin & Goetzel, P.C.

(57) ABSTRACT

A data center includes a floor that supports rack computing systems and walls that enclose a computing room. The computing room holds the rack computing systems. One of the walls is a movable wall. The movable wall translates relative to the other walls to increase or decrease the size of the computing room.

19 Claims, 12 Drawing Sheets

Related U.S. Application Data continuation of application No. 14/486,763, filed on Sep. 15, 2014, now Pat. No. 9,410,339, which is a continuation of application No. 13/603,348, filed on Sep. 4, 2012, now Pat. No. 8,833,001.

(51) Int. Cl.
  *E04H 1/00* (2006.01)
  *E04H 5/00* (2006.01)

(56) References Cited

U.S. PATENT DOCUMENTS

| | | | |
|---|---|---|---|
| 3,298,143 A | 1/1967 | Rogers et al. | |
| 3,534,512 A * | 10/1970 | Ballas | E04B 1/3445 135/115 |
| 3,629,982 A * | 12/1971 | Ballay | E04B 1/3444 52/69 |
| 3,748,793 A | 7/1973 | Tompkins et al. | |
| 3,835,600 A | 9/1974 | Padula et al. | |
| 4,037,385 A * | 7/1977 | Wahlquist | E04B 1/3445 52/745.02 |
| 4,150,682 A * | 4/1979 | Ryce | E04H 15/52 135/120.1 |
| 4,271,644 A | 6/1981 | Rilliet | |
| 4,351,135 A | 9/1982 | Freller | |
| 4,711,257 A | 12/1987 | Kobayashi | |
| 4,829,726 A | 5/1989 | de Potter d'Indoye | |
| 4,991,543 A | 2/1991 | Siberman | |
| 5,005,315 A | 4/1991 | Jackson, Jr. | |
| 5,061,001 A | 10/1991 | Madden et al. | |
| 5,167,575 A | 12/1992 | MacDonald | |
| 5,467,609 A | 11/1995 | Feeney | |
| 5,471,791 A | 12/1995 | Keller | |
| 5,491,942 A | 2/1996 | Prokasky | |
| 5,765,316 A * | 6/1998 | Kavarsky | E04B 1/3442 52/143 |
| 6,034,873 A | 3/2000 | St.ang.hl et al. | |
| 6,141,986 A | 11/2000 | Koplin | |
| 6,152,520 A | 11/2000 | Gardner | |
| 6,202,362 B1 | 3/2001 | McManus et al. | |
| 6,257,638 B1 | 7/2001 | Graber | |
| 6,526,702 B2 | 3/2003 | Jones | |
| 6,637,160 B2 * | 10/2003 | Brooks | E04B 1/0046 135/119 |
| 6,868,638 B1 | 3/2005 | Gardner | |
| 7,010,392 B2 | 3/2006 | Bash et al. | |
| 7,197,433 B2 | 3/2007 | Patel et al. | |
| 7,210,726 B2 * | 5/2007 | Merlot, Jr. | B60J 7/065 296/100.11 |
| 7,228,664 B2 | 6/2007 | Clark | |
| 7,278,273 B1 | 10/2007 | Whittled et al. | |
| 7,454,868 B2 | 11/2008 | Clark | |
| 7,511,959 B2 | 3/2009 | Belady et al. | |
| 7,551,971 B2 | 6/2009 | Hillis | |
| 7,644,543 B2 | 1/2010 | Amidon, II et al. | |
| 7,701,714 B2 | 4/2010 | Shabany | |
| 7,712,813 B2 | 5/2010 | Di Franco | |
| 7,724,513 B2 * | 5/2010 | Coglitore | H05K 7/20745 165/104.33 |
| 7,823,337 B2 | 11/2010 | Pope | |
| 7,854,652 B2 | 12/2010 | Yates | |
| 7,874,304 B2 * | 1/2011 | Ostrowski | E04B 1/34378 135/128 |
| 7,990,710 B2 | 8/2011 | Hellriegel et al. | |
| 8,077,457 B2 | 12/2011 | Gauthier et al. | |
| 8,141,374 B2 | 3/2012 | Hay | |
| 8,151,578 B1 | 4/2012 | Morales et al. | |
| 8,322,086 B2 * | 12/2012 | Weber | E04B 1/18 296/183.1 |
| 8,579,006 B2 | 11/2013 | Levin | |
| 8,739,474 B2 * | 6/2014 | Chang | E04B 1/34378 52/79.5 |
| 8,833,001 B2 | 9/2014 | Gardner et al. | |
| 10,030,383 B2 | 7/2018 | Gardner et al. | |
| 2002/0112412 A1 | 8/2002 | Jones | |
| 2004/0244308 A1 * | 12/2004 | Alusoski | E04B 1/34357 52/64 |
| 2005/0055891 A1 | 3/2005 | Kuebler | |
| 2005/0170770 A1 * | 8/2005 | Johnson | H05K 7/20836 454/184 |
| 2005/0228618 A1 | 10/2005 | Patel et al. | |
| 2005/0279047 A1 * | 12/2005 | Kalnay | E04B 1/34305 52/641 |
| 2006/0065000 A1 | 3/2006 | Belady | |
| 2006/0117673 A1 | 6/2006 | McManus et al. | |
| 2006/0230704 A1 | 10/2006 | Lambreth | |
| 2007/0101746 A1 | 5/2007 | Schlom et al. | |
| 2007/0167125 A1 | 7/2007 | Rasmussen et al. | |
| 2007/0213000 A1 | 9/2007 | Day | |
| 2007/0274043 A1 | 11/2007 | Shabany | |
| 2008/0029250 A1 | 2/2008 | Carlson et al. | |
| 2008/0055846 A1 | 3/2008 | Clidaras et al. | |
| 2008/0055850 A1 | 3/2008 | Carlson et al. | |
| 2008/0094797 A1 | 4/2008 | Coglitore et al. | |
| 2008/0158818 A1 | 7/2008 | Clidaras et al. | |
| 2008/0236765 A1 * | 10/2008 | Sager | E04H 15/52 160/84.06 |
| 2008/0259566 A1 | 10/2008 | Fried | |
| 2008/0270572 A1 | 10/2008 | Belady et al. | |
| 2009/0046427 A1 | 2/2009 | Noteboom et al. | |
| 2009/0168345 A1 | 7/2009 | Martini | |
| 2009/0195977 A1 | 8/2009 | Fink et al. | |
| 2009/0199491 A1 | 8/2009 | Boldt | |
| 2009/0207567 A1 | 8/2009 | Campbell et al. | |
| 2009/0210096 A1 | 8/2009 | Stack et al. | |
| 2009/0223141 A1 | 9/2009 | Behrens | |
| 2009/0229194 A1 * | 9/2009 | Armillas | E04H 1/1205 52/79.1 |
| 2009/0272048 A1 | 11/2009 | Amidon, II et al. | |
| 2009/0301123 A1 | 12/2009 | Monk et al. | |
| 2010/0144265 A1 * | 6/2010 | Bednarcik | H05K 7/20745 454/184 |
| 2010/0162636 A1 | 7/2010 | Bonebrake | |
| 2010/0188810 A1 | 7/2010 | Andersen et al. | |
| 2011/0023388 A1 | 2/2011 | Tong et al. | |
| 2011/0083824 A1 | 4/2011 | Rogers | |
| 2011/0113693 A1 | 5/2011 | Liebscher et al. | |
| 2011/0256822 A1 * | 10/2011 | Carlson | F24F 5/0035 454/184 |
| 2012/0104918 A1 | 5/2012 | Peng et al. | |
| 2013/0061624 A1 | 3/2013 | Zwinkels | |

FOREIGN PATENT DOCUMENTS

| | | |
|---|---|---|
| JP | H03202534 | 9/1991 |
| JP | 3733015 | 1/2006 |
| JP | 2006002419 | 1/2006 |
| JP | 2007285082 | 11/2007 |
| JP | 2009063226 | 3/2009 |
| WO | 2004083743 | 9/2004 |

OTHER PUBLICATIONS

Patent Examination Report No. 1 from Australian Application No. 2013312839, dated Nov. 10, 2015, Amazon Technologies, Inc., pp. 1-3.
U.S. Appl. No. 12/491,941, filed Jun. 25, 2009, Osvaldo P. Morales.
U.S. Appl. No. 12/341,137, filed Dec. 28, 2008, Jonathan David Hay.
U.S. Appl. No. 11/956,849, filed Dec. 14, 2007, Osvaldo P. Morales.
U.S. Appl. No. 12/163,146, filed Jun. 27, 2008, Osvaldo P. Morales.
U.S. Appl. No. 12/568,323, filed Sep. 28, 2009, Michael P. Czamara.
U.S. Appl. No. 13/525,057, filed Jun. 15, 2012, John W. Eichelberg et al.
U.S. Appl. No. 13/603,341, filed Sep. 4, 2012, Brock R. Gardner.
U.S. Appl. No. 13/792,962, filed Mar. 11, 2013, John W. Eichelberg.
U.S. Appl. No. 13/525,060, filed Jun. 15, 2012, John W. Eichelberg.
U.S. Appl. No. 13/525,057, filed Jun. 15, 2012, John W. Eichelberg.
U.S. Appl. No. 13/525,053, filed Jun. 15, 2012, John W. Eichelberg.
International Search Report and Written Opinion in application No. 201201861-0 dated May 28, 2013 pp. 1-12.

(56) References Cited

OTHER PUBLICATIONS

Office Action from Japanese Patent Application No. 2012-532222, dated Nov. 27, 2012 (English Translation and Japanese Versions), pp. 1.
International Search Report from PCT/US 10/50408 dated Jan. 26, 2011, pp. 1-9.
Office Action from U.S. Appl. No. 12/568,323, dated Jun. 20, 2013, Michael P. Czamara et al pp. 1-26.
Office Action from U.S. Appl. No. 12/568,323, dated Jan. 9, 2013, Michael P. Czamara et al pp. 1-8.

* cited by examiner

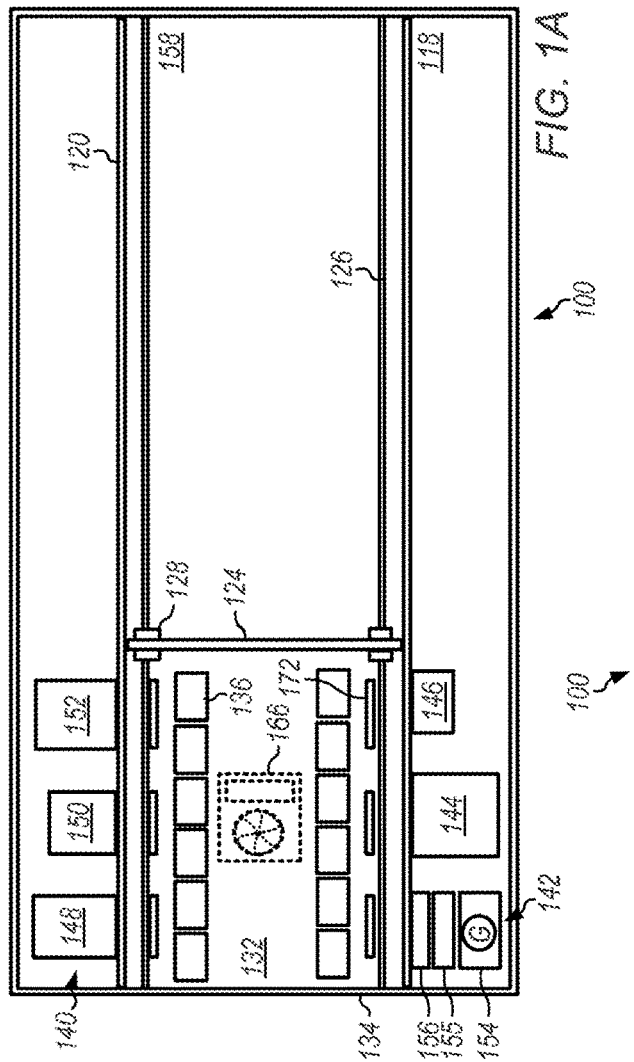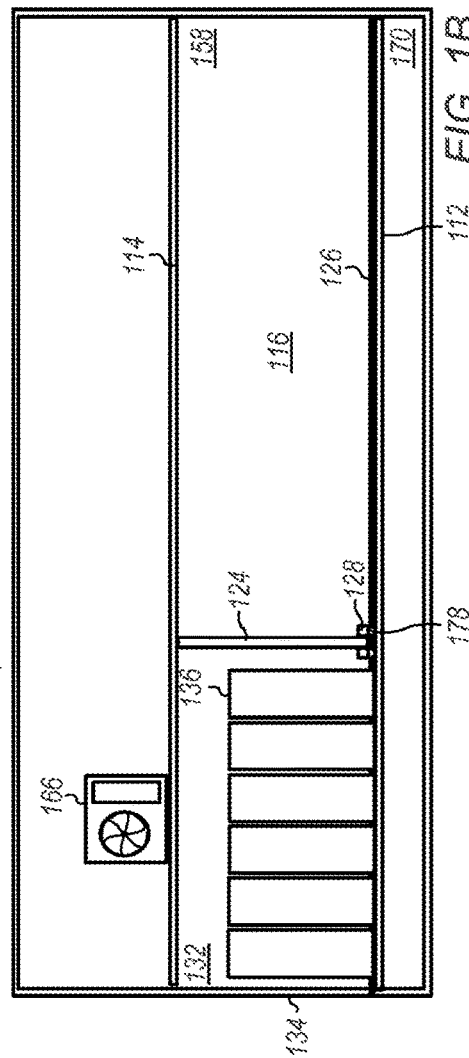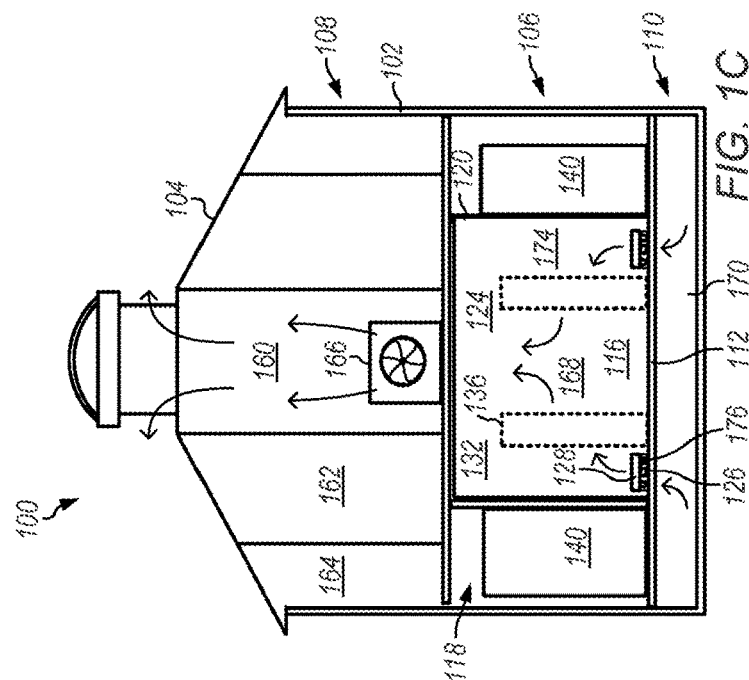

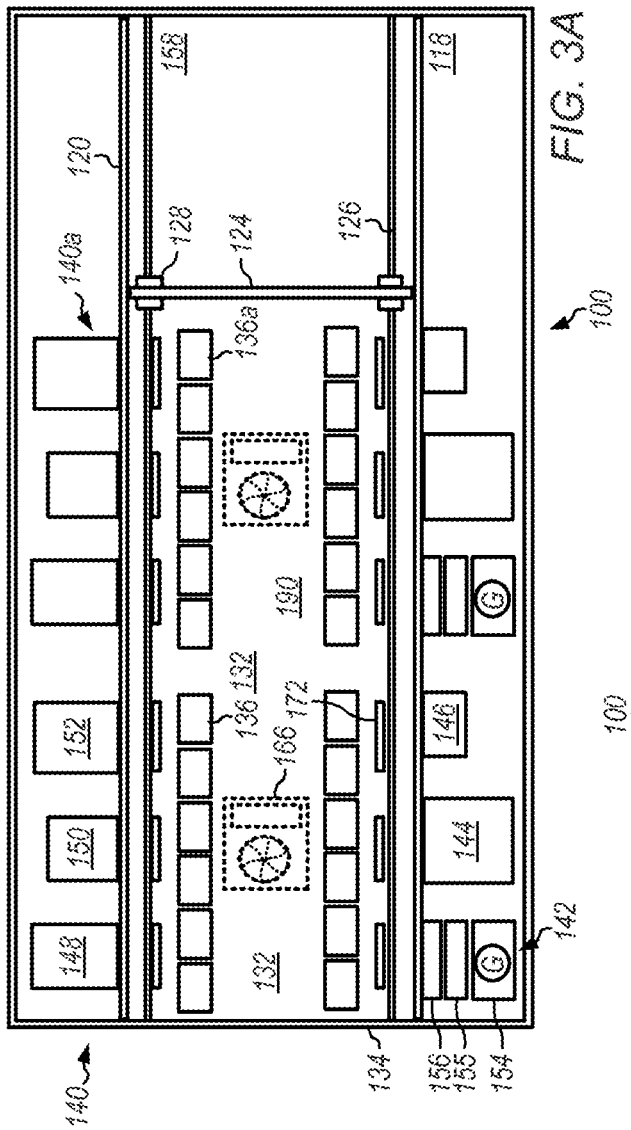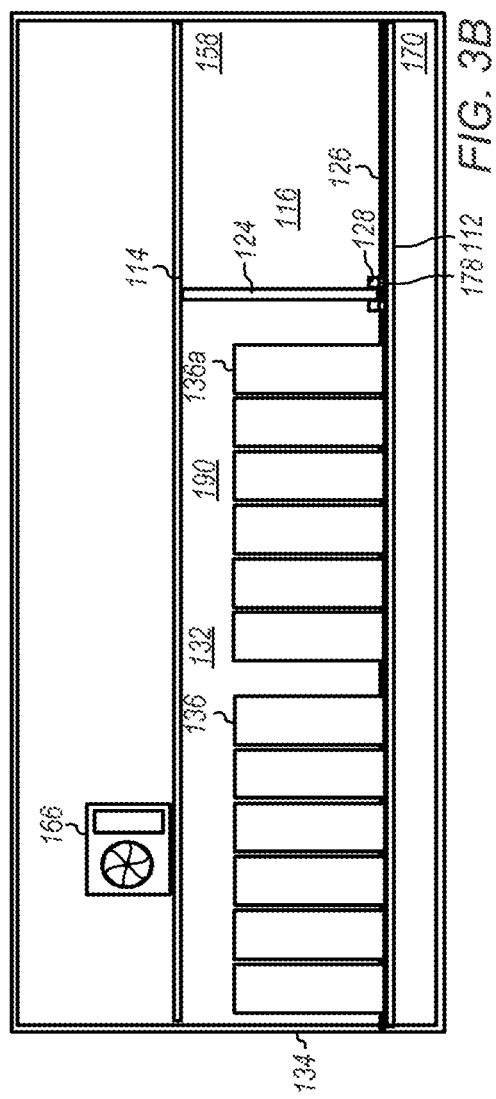

EXPANDABLE DATA CENTER WITH MOVABLE WALL

This application is a continuation of U.S. patent application Ser. No. 15/231,630, filed Aug. 8, 2016, now U.S. patent Ser. No. 10/030,383, which is a continuation of U.S. patent application Ser. No. 14/486,763, filed Sep. 15, 2014, now U.S. Pat. No. 9,410,339, which is a continuation of U.S. patent application Ser. No. 13/603,348, filed Sep. 4, 2012, now U.S. Pat. No. 8,833,001, which are hereby incorporated by reference in their entirety.

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Because a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 110V). A network of cabling, bus bars, power connectors, and power distribution units, is used to deliver the power at the lower voltage to numerous specific components in the facility.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a racking system. Some known racking systems include 40 such rack-mounted components and such racking systems will therefore generate as much as 10 kilowatts of waste heat. Moreover, some known data centers include a plurality of such racking systems. Some known data centers include methods and apparatus that facilitate waste heat removal from a plurality of racking systems, typically by circulating air through one or more of the rack systems.

Many data center includes numerous rack-mounted servers housed in a building, which provides protection operating equipment. Such buildings may require a substantial investment in the form of construction costs, maintenance costs, and/or leasing costs. In addition, substantial time and resources are typically required to design and build a data center (or expansion thereof), lay cables, install racks and cooling systems. Additional time and resources are typically needed to conduct inspections and obtain certifications and approvals, such as for electrical and HVAC systems.

Many data centers rely on forced air systems and air conditioning to maintain the temperatures and other environmental conditions in the data center within acceptable limits. The initial and ongoing costs of installing and operating these systems may add substantial cost and complexity to data center operations.

The amount of computing capacity needed for any given data center may change rapidly as business needs dictate. Most often, there is a need for increased computing capacity at a location. Initially providing computing capacity in a data center, or expanding the existing capacity of a data center (in the form of additional servers, for example), is resource-intensive and may take many months to effect.

BRIEF DESCRIPTION OF THE DRAWINGS

FIGS. 1A, 1B, and 1C illustrate a data center having a movable wall for a computing room.

FIGS. 3A and 3B illustrate a plan view and a side elevation view, respectively, of a data center after a movable wall has been translated to increase the length of a computing room.

Figure 2:
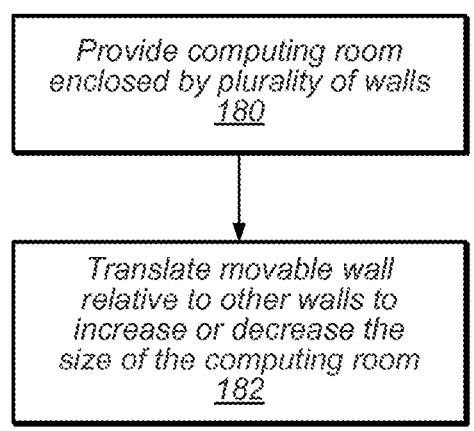
FIG. 2 is a flow diagram illustrating one embodiment of expanding changing the size of a computing room of a data center by translating a movable wall.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Systems and methods for providing computing resources are disclosed. According to one embodiment, a data center includes a floor that supports rack computing systems and walls that enclose a computing room. The computing room has a length and a width. The computing room holds the rack computing systems. The walls include a pair of opposing parallel walls defining the width of the computing room and one or more movable walls. At least one of the movable walls substantially spans the opposing parallel walls. The movable walls can translate to increase or decrease the length of the computing room.

According to one embodiment, a data center includes a floor that supports rack computing systems and walls that enclose a computing room. The computing room has a length and a width. The computing room holds the rack computing systems. One of the walls is a movable wall. The movable wall translates relative to the other walls to increase or decrease the size of the computing room.

According to one embodiment, a method of changing the size of a computing room includes providing a computing room enclosed by walls. A movable wall is translated relative to the other walls of the computing room to increase or decrease the size of the computing room.

According to one embodiment, a method of enlarging a computing room includes moving a movable wall of a computing room away from one or more other walls of the computing room such that a gap is created in an expansion zone between the movable wall and the other walls. One or more side modules are coupled in the gap between the movable wall and the other walls such that the side modules, the movable wall, and the other walls define an enlarged computing room that includes the expansion zone.

According to one embodiment, a method of enlarging a computing room includes extending support structure elements from a computing room into an expansion zone for the computing room. One or more side modules are coupled to the supporting structure elements in the expansion zone for the computing room to enclose an enlarged computing room.

According to one embodiment, a data center includes a floor that supports rack computing systems and walls. One of the walls is a movable end wall that can be moved away from the other walls of the computing room to create an expansion zone between the movable wall and the other walls. Side modules can couple in a gap between the movable wall and the one or more other walls such that the one or more side modules, the movable wall, and at least one of the other walls define an enlarged computing room that includes the expansion zone.

According to one embodiment, a data center includes rack computing systems, a floor that supports the rack computing systems, two or more opposing end walls, two or more side modules. The side modules and end walls are arranged to enclose a computing room for the rack computing systems. One of the end walls is movable to allow insertion of additional side modules along the sides of the computing room to enlarge the computing room.

As used herein, "data center infrastructure" means systems, components, or elements of a system that provide resources for computing devices, such as electrical power, data exchange capability with external systems, air, heat removal, and environmental control (for example, humidity control, particulate control).

As used herein, a "modular panel" includes a panel, plate, frame, that can partially enclose a space. A modular panel may have one or more openings. In some embodiments, a modular panel works in combination with other elements to partially enclose a space. For example, a data center infrastructure module may couple in an opening of the modular panel such that the data center infrastructure module and the modular panel combine to enclose a computing room.

As used herein, "room" means a room or a space of a building. As used herein, "computing room" means a room of a building in which computing devices, such as rack-mounted servers, can be operated.

As used herein, a "support structure element" includes one or more elements that support elements that enclose a computing room. Examples of support structure elements include a floor, slab, false floor, rail, frame, rod, bar, or scaffold.

As used herein, an "aisle" means a space next to one or more racks.

As used herein, "air handling system" means a system that provides or moves air to, or removes air from, one or more systems or components.

As used herein, "air moving device" includes any device, element, system, or combination thereof that can move air. Examples of air moving devices include fans, blowers, and compressed air systems.

As used herein, "ambient" refers to a condition of outside air at the location of a system or data center. An ambient temperature may be taken, for example, at or near an intake hood of an air handling system.

As used herein, a "cable" includes any cable, conduit, or line that carries one or more conductors and that is flexible over at least a portion of its length. A cable may include a connector portion, such as a plug, at one or more of its ends.

As used herein, a "cold aisle" means an aisle from which air can be drawn for use in removing heat from a system, such as a rack computing system.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, a "hot aisle" means an aisle into which heated air can be discharged for use in removing heat from a system, such as a rack computing system.

As used herein, "mechanical cooling" means cooling of air by a process that involves doing mechanical work on at least one fluid, such as occurs in vapor-compression refrigeration systems.

As used herein, a "module" is a component or a combination of components physically coupled to one another. A module may include functional elements and systems, such as computer systems, circuit boards, racks, blowers, ducts, and power distribution units, as well as structural elements, such a base, frame, housing, or container.

As used herein, an "operating environment", in the context of computing resources, means the space, facilities and infrastructure resources provided for the computing resources. An operating environment for a set of rack computing systems includes the space, power, data interchange, cooling, and environmental control resources provided for the set of computing systems.

As used herein, "power distribution unit" refers to any device, module, component, or a combination thereof, that can be used to distribute electrical power. The elements of a power distribution unit may be embodied within a single component or assembly (such as a transformer and a rack power distribution unit housed in a common enclosure), or may be distributed among two or more components or assemblies (such as a transformer and a rack power distribution unit each housed in separate enclosure, and associated cables, etc.)

As used herein, "power panel" means any panel, device, module, component, or combination thereof, that can be used to transfer or distribute electrical power from one or more input conductors to one or more output conductors. In certain embodiments, a remote power panel includes main lug only panel conductors. A remote power panel may be housed in an enclosure, such as a cabinet.

As used herein, "rack computing systems" means a computing system that includes one or more computing devices mounted in a rack.

As used herein, a "space" means a space, area or volume.

FIG. 1A is a plan view illustrating one embodiment of a data center having a movable wall for a computing room. FIG. 1B is a side elevation view illustrating the data center shown in FIG. 1A. FIG. 1C is an end elevation illustrating the data center shown in FIG. 1A. Data center 100 includes exterior walls 102 and roof 104. Exterior walls 102 and roof 104 encloses ground-level space 106, second-level space 108, and subfloor space 110.

Ground level space is bounded by floor 112 and ceiling 114. Ground-level space 106 includes hall 116 and peripheral room 118. Hall 116 is separated from peripheral spaces 118 by side walls 120.

Data center 100 includes movable wall 124. Movable wall 124 includes panel 126 and roller assemblies 128. Movable wall 124 may span hall 118 between side walls 120. Movable wall 124 may run from floor 130 of hall 116 to ceiling 114.

Computing room 132 is enclosed by opposing side walls 120, end wall 134, and movable wall 124. Computing room 132 houses rack computing systems 136. Each of rack computing systems 136 may include computing devices, such as servers, as well as other systems and devices for supporting computing operations in computing room, such as power supply units, rack power distribution units, and fans.

Data infrastructure modules 140 are provided in peripheral rooms 118. Data center infrastructure modules 140 may provide infrastructure resources, such as electrical power, cooling air, network connections, and storage, for compute resources in computing room. In FIG. 1A, data center infrastructure modules 140 include electrical power system 142, mechanical module 144, network module 146, secure storage module 148, office space module 150, and payment transfer system module 152. Electrical power system 142 may include generator 154, uninterruptible power supply 155, and power distribution unit 156. In some embodiments, different side modules are interchangeable with one another. For example, office space module 150 and payment transfer system module 152 have the same mounting interface, such that either of the modules can be mounted in any slot in an interior frame. In one embodiment, a data center infrastructure module includes a loading dock. The loading dock may be used to transfer computing resources and data center infrastructure into or out of a computing room. The loading dock module may include door. The door may be used to control access through the module and protect computing resources from environmental conditions outside of the modules.

In some embodiments, opposing side walls 120, end wall 134, movable wall 124, ceiling 114, and floor 106 may combine to serve as a plenum for air used to cool computing devices in rack computing systems 134. For example, air may be maintained at a higher pressure inside computing room 132 than in the portion of hall 114 outside of computing room 132. In some embodiments, sealing elements (such as flaps) are provided at the junctions between movable 124 and the adjoining elements of the enclosure, such as side walls 120, floor 130, and ceiling 114. In some embodiments, fire retardant materials are used for the main structure of movable wall 124, the sealing elements, or both.

Movable wall 124 may divide computing space from non-computing space. For example, computing room 124 may be suitable for holding rack-mounted computing devices to perform computing operations. Non-computing space 158 may be used for purposes other than computing, such as equipment storage, office space, or warehouse space. In certain embodiments, non-computing space 158 holds systems used to provide data center infrastructure, such as CRACs, UPSs, generators, power panels, or network switches.

Second-level space 108 includes exhaust plenum 160, catwalk 162, and mixing plenum 164. Air handling system 146 may be installed in second level space 108. Air handling systems 166 may draw air from host aisle 168 of computing room 132 through an opening in ceiling 114 and exhaust the air into exhaust plenum 160. Air in exhaust plenum 160 may be discharged to the outside by way of roof vent 162.

In some embodiments, mixing plenum 164 mixes air removed from computing room 132 with air from outside the data center. Air from mixing plenum 164 may be ducted into computing room 132.

Subfloor space 110 includes subfloor plenum 170. Subfloor plenum 170 may hold a source of air for removing heat from computing devices in rack computing systems 136. Floor vents 172 allow air from subfloor plenum 170 to be drawn into cold aisles 174. The arrows in FIG. 1C illustrate one example of air flow in a data center.

From time to time, the amount of computing space needed for a data center may increase or decrease. In some embodiments, a movable wall is translated to increase or decrease the size of a computing room. For example, in the data center shown in FIGS. 1A through 1C, movable wall 124 may be translated along side walls 120 relative to end wall 134 to increase or decrease the length of computing room 114. In this example, the width of computing room 114 remains constant, regardless of the position of movable wall 114. Movable wall may be rolled on rollers 178 of roller assemblies 128. Movable wall 124 may be guided by floor rails 126. In certain embodiments, a movable wall may be carried on floor rails or tracks.

FIG. 2 is a flow diagram illustrating one embodiment of expanding changing the size of a computing room of a data center by translating a movable wall. At 180, a computing room enclosed by a plurality of walls is provided. If expansion of the computing space, an expansion zone may be added to a computing space by moving a wall to encompass the expansion zone. The expansion zone may be prepared in a data center for expanding the computing space in the data center. Initially, the expansion zone may be raw space, or otherwise not ready to support compute resources. To prepare the expansion zone for use as computing space, ceilings, and walls in the expansion zone may be finished. Electrical power, cooling air, network cables, and other data infrastructure elements may be routed to the expansion zone.

At 182, a movable wall is translated relative to the other walls of the computing room to increase or decrease the size of the computing room. The movable wall may be, for example, translated away from an opposing wall to increase the length of the computing room.

FIGS. 3A and 3B illustrate a plan view and a side elevation view, respectively, of a data center after a movable wall has been translated to increase the length of a computing room. Relative to FIGS. 1A and 1B, movable wall 124 has been moved away from end wall 134 to increase the length of computing room 132 and encompass expansion zone 190. Rack computing systems 136a have been added in expansion zone 190. Data center infrastructure modules 140a have been added to provide infrastructure for rack computing systems 136a in expansion zone 180. In certain embodiments, some or rack computing systems 136a are supported by data center infrastructure modules 140, and some or all of data center infrastructure modules 140a may be omitted.

In some embodiments, a computing room is enlarged by adding side modules in an expansion zone. Enlarging a computing room may include extending support structure elements from the computing room into an expansion zone for the computing room. Side modules may be coupled to the support structure elements in the expansion zone to enclose an enlarged computing room. In some embodiments, enlarging a computing room includes moving an end wall relative to one or more other walls of a computing room. Gaps at the expansion zone may be filled with side modules.

Figure 4:
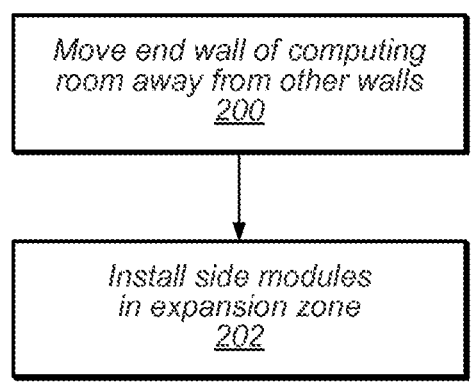
FIG. 4 illustrates enlarging a computing room of a data center by adding side modules.

FIG. 4 illustrates enlarging a computing room of a data center by adding side modules. At 200, an end wall of a computing room is moved away from one or more other walls of the computing room such that a gap is created in an expansion zone between the movable wall and the one or more other walls of the computing room.

In some embodiments, support structure elements are extended from a computing room into an expansion zone for the computing room. Examples of support structure elements include section of floor (such as a concrete slab), raised rails, floor rails, beams, frames, trusses, or posts.

At 202, side modules are installed in the expansion zone for a computing room. The side modules may be coupled to supporting structure elements, such as a frame, rail, or floor. The side modules may be arranged to enclose additional computing space. Side modules in the expansion zone may, in combination with other enclosing elements, define an enlarged computing room.

Figure 5:
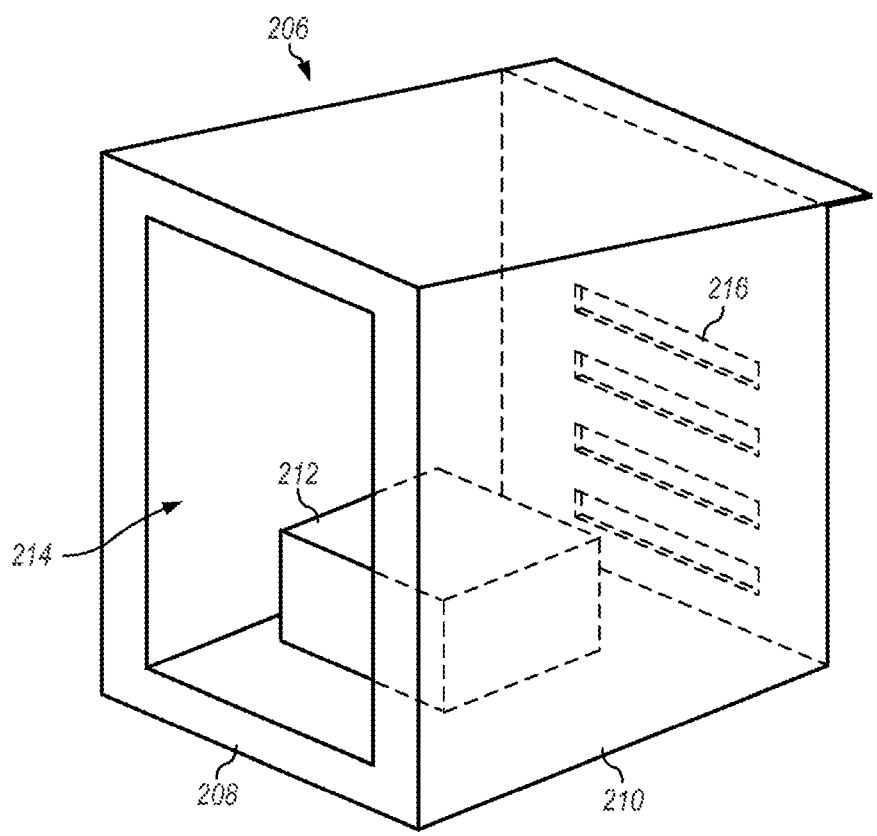
FIG. 5 illustrates one embodiment of a side module that can be used on the side of computing room of a data center.

FIG. 5 illustrates one embodiment of a side module that can be used on the side of computing room of a data center.

Side module 206 includes face frame 208, enclosure 210, and systems 212. Opening 214 is provided in frame 208. Louvers 216 may be provided on the exterior wall of side module 206 to provide air flow into enclosure 210.

In some embodiments, side module (such as side modules 206) couple with interior frame members for a computing room. Examples of interior frame members for a computing room include a rail, stud, column, beam, or joist.

Systems 212 in each of side modules 206 may vary from module to module. Some modules may include systems for providing infrastructure resources, such as electrical power, cooling air, network connections, and storage, for compute resources in a computing room. In some embodiments, different functions are provided by each side module. For example, one side module may include mechanical equipment for cooling, another side module may provide electrical power, and another may provide network connections to systems external to the computing room. Power cables, data cables, or cooling air may be provided to computing resources in the computing room through the opening 214 in frame 208.

Figure 6:
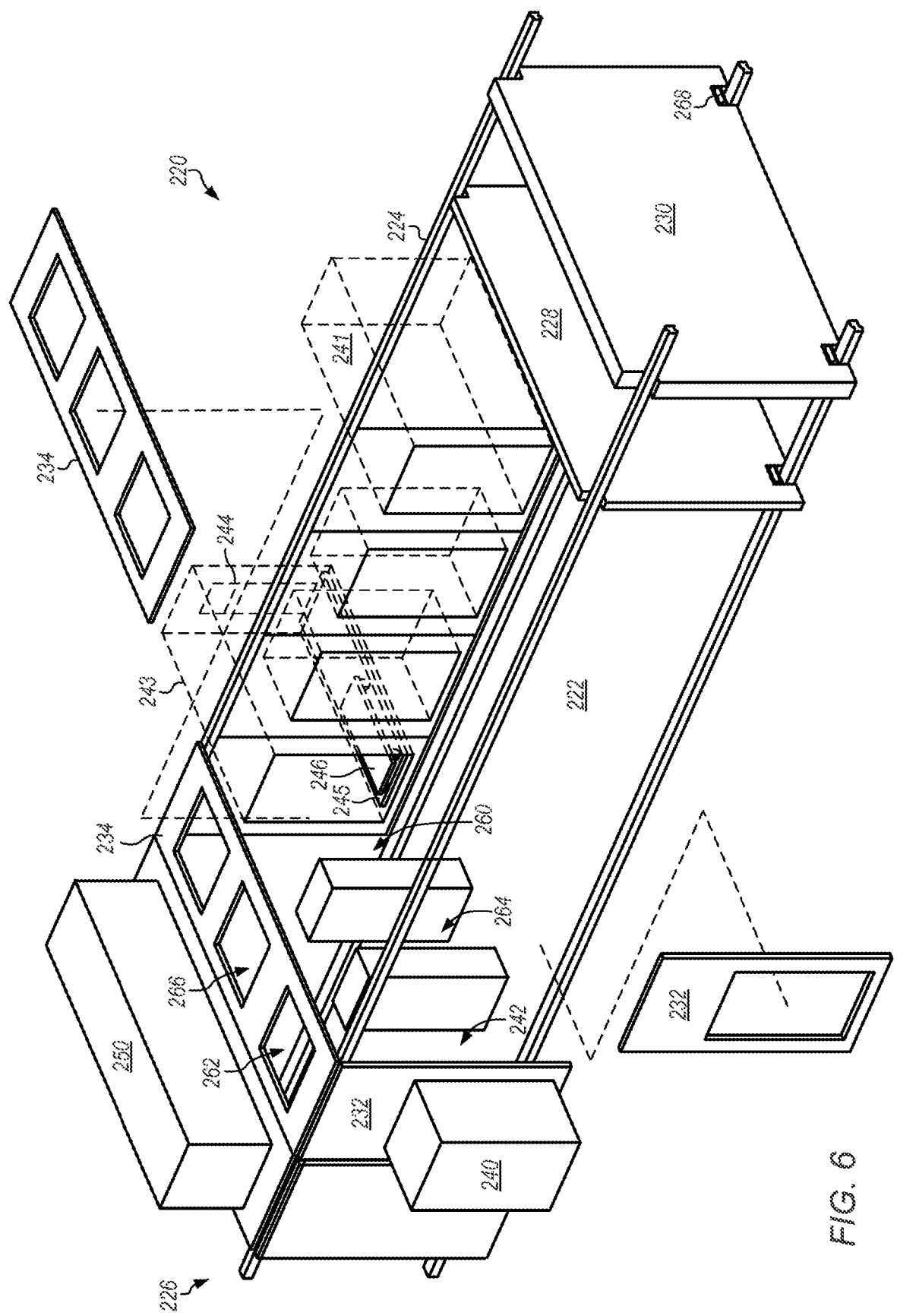
FIG. 6 illustrates one embodiment of a data center having side modules that can be used to increase the size of a computing room.

FIG. 6 illustrates one embodiment of a data center having side modules that can be used to increase the size of a computing room. Data center 220 includes floor 222, floor rails 268, raised rails 224, modular panels 226, interior wall 228, and exterior wall 230.

Modular panels 226 include modular side panels 232 and modular ceiling panels 234. Modular panels 226 include modular side panels 232 and modular ceiling panels 234 may be installed on raised rails 224. In some embodiments, fasteners, such screws, bolts, or clips, are used to secure modular side panels 232 and modular ceiling panels 234 on raised rails 224.

Rack computing systems 238 may be operated in computing room 242. Computing room 242 may be enclosed by modular panels 226, interior wall 228, and floor 222.

Data center 220 includes data center infrastructure modules 240. Data center infrastructure modules 240 and 241 may be coupled to any or all of modular panels 226. Each combination of a data center infrastructure module 240 and modular side panel 226 may serve as a side module. Data center infrastructure modules 240 may provide infrastructure resources, such as electrical power, cooling air, network connections, and storage, for compute resources in computing room 242. Data center infrastructure module 241 may include a hallway that spans between computing room 242 and another computing room in data center 220. Data center infrastructure modules 240 may be similar to data center infrastructure modules 140 described above relative to FIGS. 1A-1C. Thus, data center infrastructure modules 240 may include, for example, mechanical modules, network modules, secure storage modules, office space modules, and secure payment modules. Data center infrastructure modules 240 includes a loading dock module 243. Loading dock module 243 includes loading door 244, loading platform 245, and truck 246. Loading door 244 may be used to control access through the module and protect computing resources from environmental conditions outside of the modules.

In some embodiments, cooling modules are mounted on a ceiling panel of an expandable data center. For example, in the data center shown in FIG. 6, cooling module 250 is mounted on one of ceiling modular panels 234. Cooling module 250 may be operated to introduce cool air to into cold aisles 260 in computing room 242 through lateral openings 262 of modular ceiling panel 234, and remove heated air from hot aisle 264 computing room 242 through center opening 266 of modular ceiling panel 234.

Interior wall 228 and exterior wall 230 may be translated on floor rails 268 and raised rails 224. Interior wall 228 and exterior wall 230 each include rollers 260. Rollers 260 may be used to facilitate moving of interior wall 228 and exterior wall 230. In certain embodiments, interior wall 228 and exterior wall 230 include a drive system. Drive systems may be operated to move interior wall 228 and exterior wall 230 from one position to another. A drive system may include motors, cables, pulleys, wheels, gantries or other systems or devices for moving a wall. In certain embodiments, an interior wall, exterior wall, or both, are carried (for example, hung), on structural elements above or along the sides of the walls. Rollers or sliders may be provided along the sides or on top of the interior wall or exterior to allow the wall to be carried on the structural elements.

Figure 7:
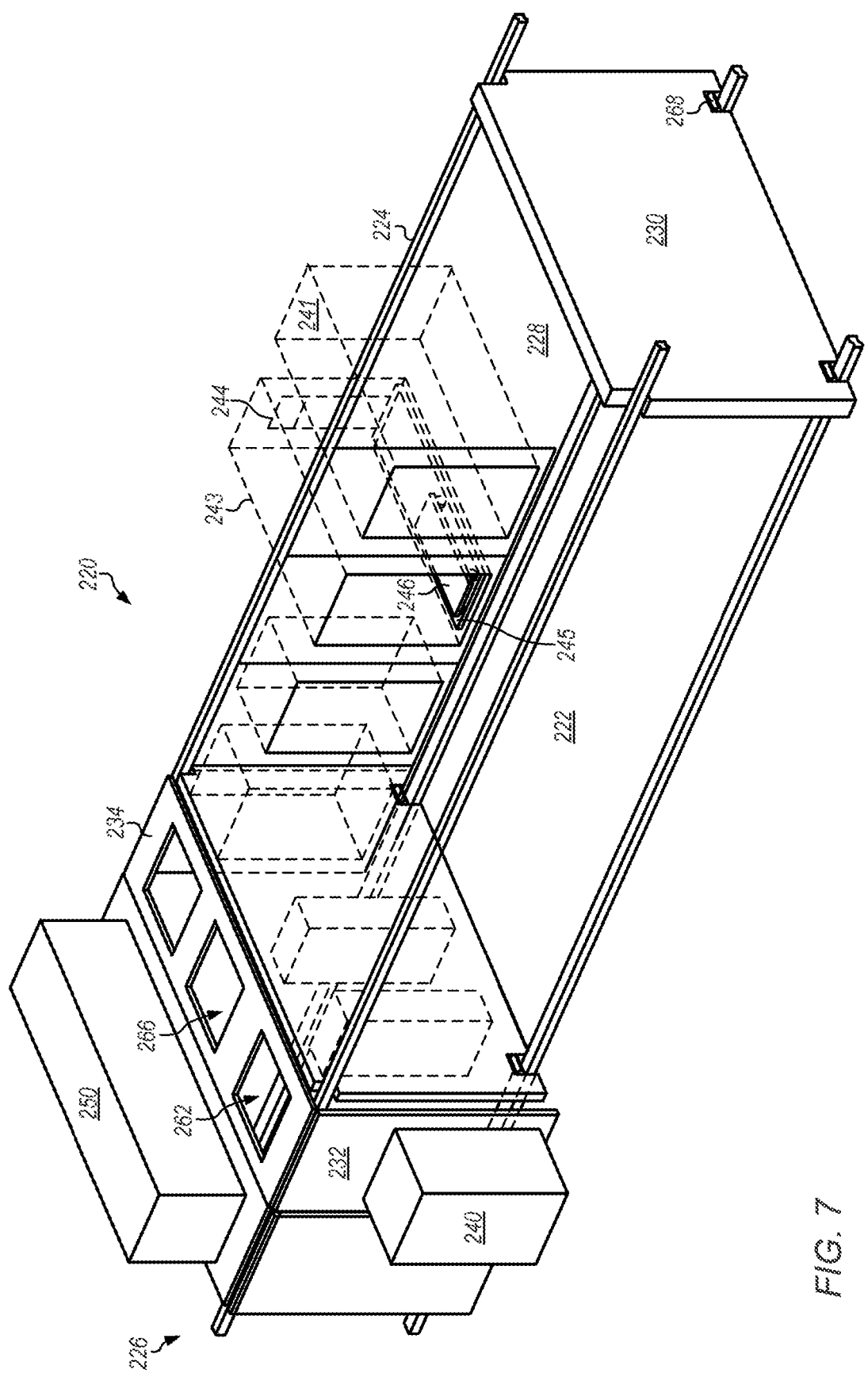
FIG. 7 illustrates one embodiment of a data center in which a movable wall has been positioned to serve as an end wall of a computing room.

In some embodiments, a movable wall is used in combination with modular panels to enclose a computing room of a data center. FIG. 7 illustrates one embodiment of a data center in which a movable wall has been positioned to serve as an end wall of a computing room. In this example, interior wall 228 has been moved to enclose computing room 242.

In the example shown in FIG. 7, the portion of data center 220 outside of computing room 242 may be raw space that is not yet ready to support computing operations. In some cases, the raw space may be used for purposes other than computing, such as equipment storage.

Exterior wall 230 may remain spaced away from interior wall 228. In some embodiments, exterior wall 232 provides protection from outdoor environmental conditions, such as rain, in the portion of the data center outside computing room 242.

As the need arises, a computing room may be made larger or smaller by installing or removing modular panel and data infrastructure modules. In some embodiments, a movable wall is pulled away from existing panels to encompass an expansion zone for more compute resources. In some embodiments, modular panels or infrastructure modules, or both, are added to previously installed supporting structure elements. In certain embodiments, supporting structure elements are added on an as-needed basis in advance of expanding computing space. For example, in the data center shown in FIGS. 6 and 7, sections of floor 222 may be added by pouring additional sections of concrete slab. As another example, sections of floor rails 268, raised rails 224, or both may be added as needed. In certain embodiments, additional structural elements for a hanging wall, such as a side rails or overhead rails, are added to a data center to allow the movable wall to be moved out to increase the length of a computing room.

Figure 8A:
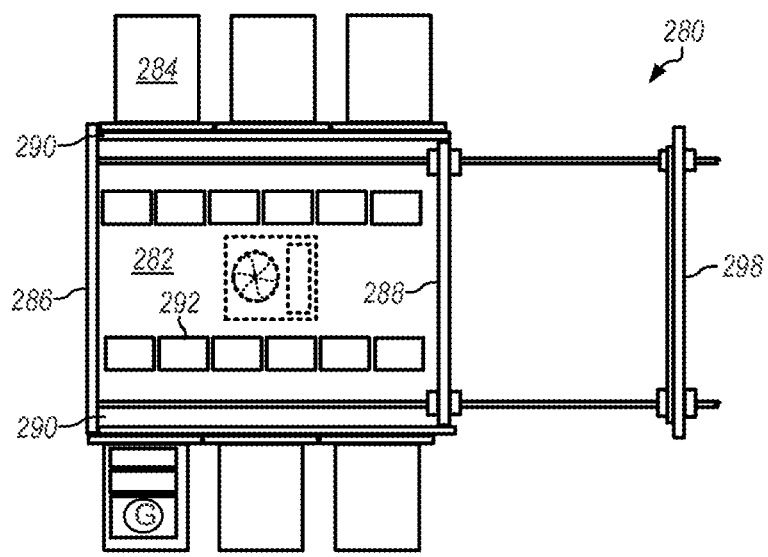
FIGS. 8A and 8B illustrate a data center with a computing room that is bounded by side modules.
Figure 8B:
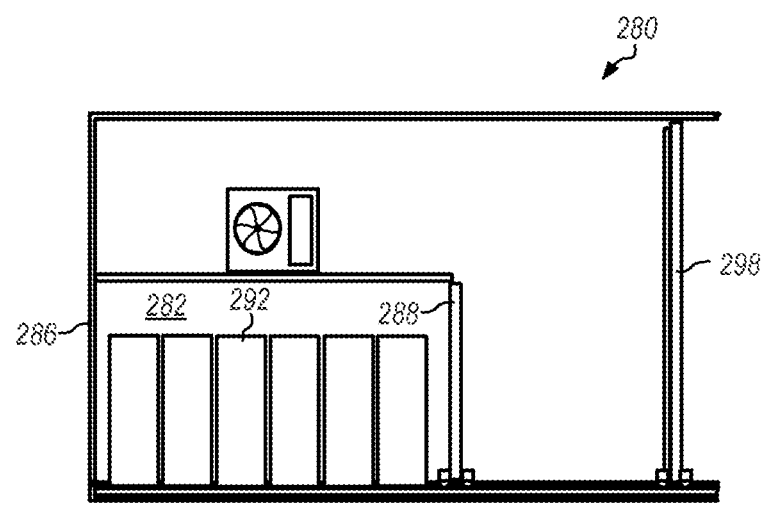

FIGS. 8A and 8B illustrate a data center with a computing room that is bounded by side modules. Data center 280 includes computing room 282. Computing room 282 is enclosed by side modules 284, end wall 286, and movable interior wall 288. Side modules 284 are coupled on interior frames 290. Computing room 282 houses rack computing systems 292. Computing room 282 is located under second-level structure 294.

Figure 9A:
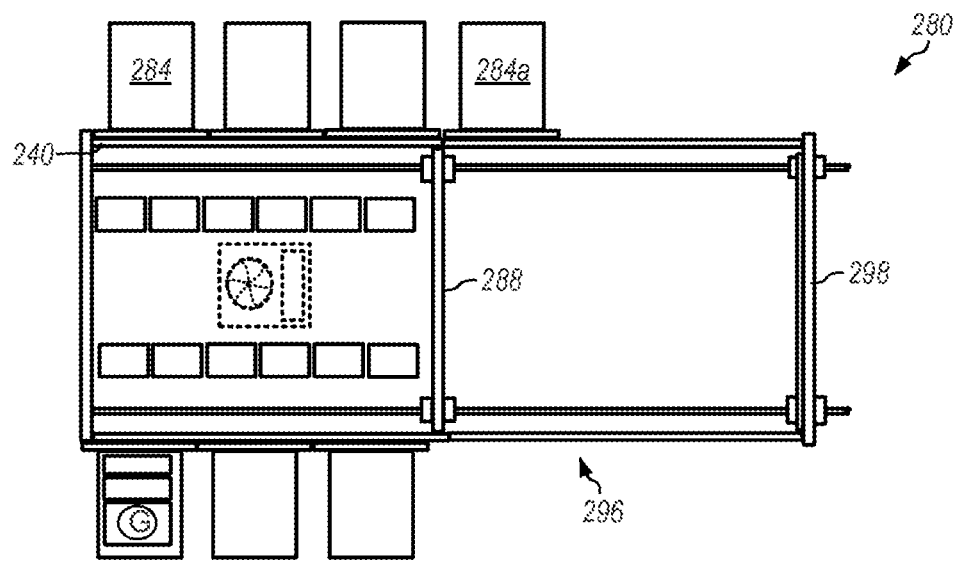
FIGS. 9A and 9B illustrate extending support structure elements to enlarge a computing room of a data center.
Figure 9B:
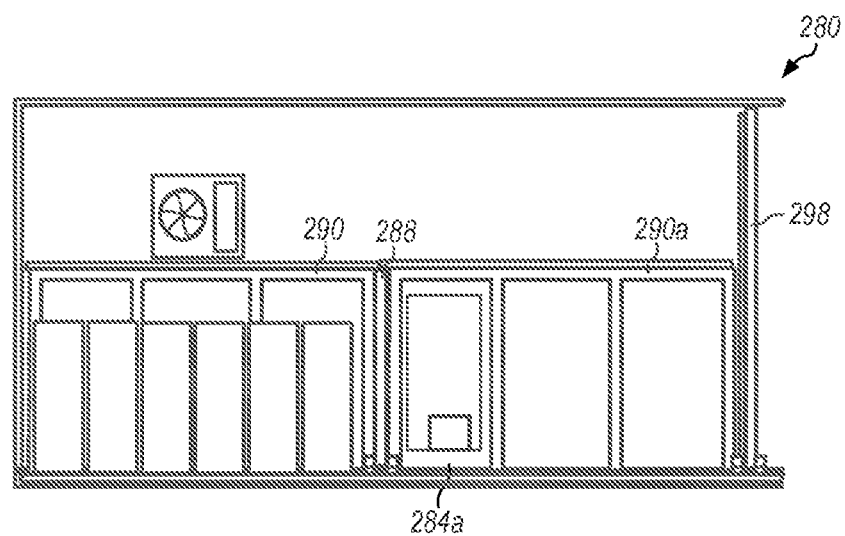

FIGS. 9A and 9B illustrate extending support structure elements to enlarge a computing room of a data center. Relative to FIGS. 9A and 9B, interior frames 290a have been added to rails 290 in expansion zone 296. Side modules 284a may be coupled to interior frames 290a. Movable exterior wall 298 may provide protection from environmental elements during preparation of expansion zone 296.

Figure 10A:
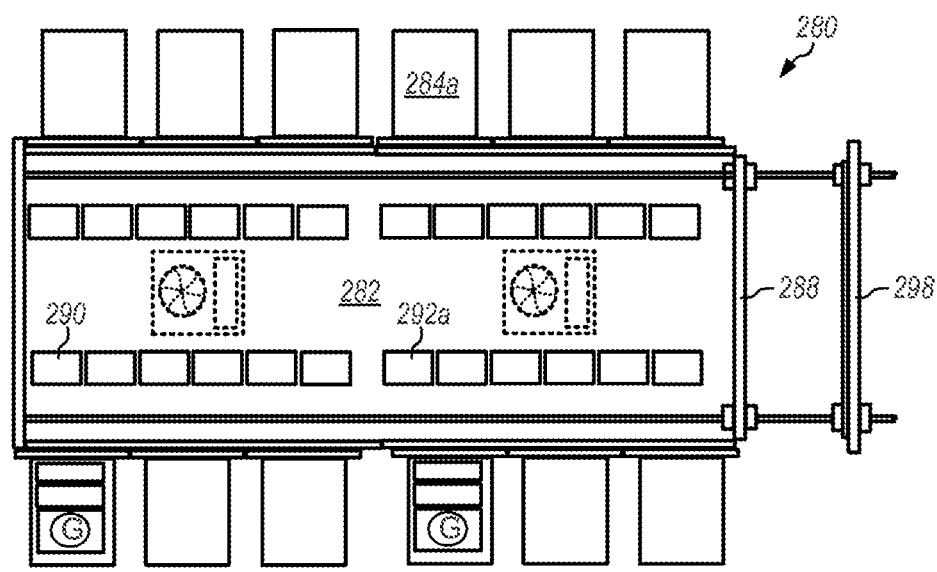
FIGS. 10A and 10B illustrate an enlarged computing room.
Figure 10B:
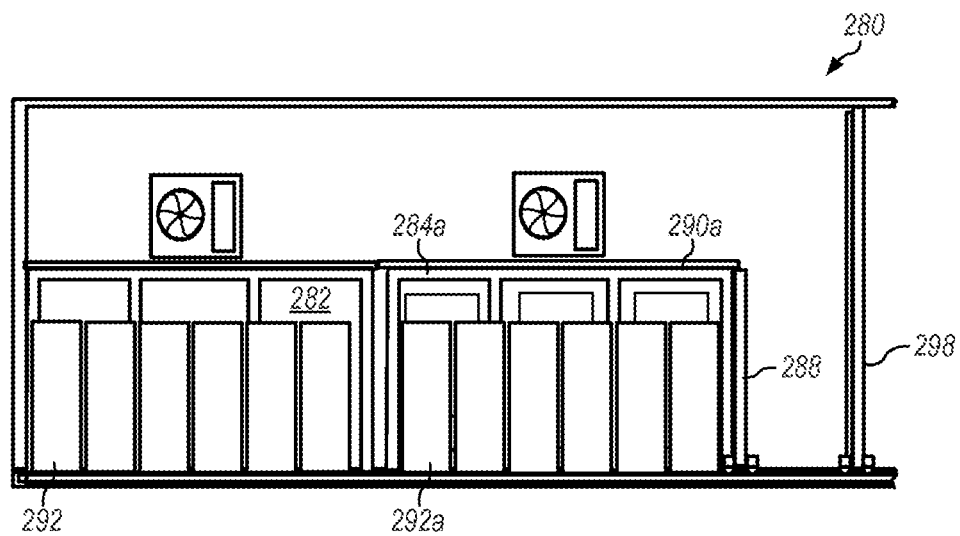

FIGS. 10A and 10B illustrate an enlarged computing room. Relative to FIGS. 9A and 9B, interior wall 288 has been moved such that computing room 282 encompasses expansion zone 296. Rack computing systems 292a have been added to computing room 282 in expansion zone 296. Side modules 284a may provide data center infrastructure, such as electrical power, network connections, and cooling, for computing devices in rack computing systems 292a.

Figure 11:
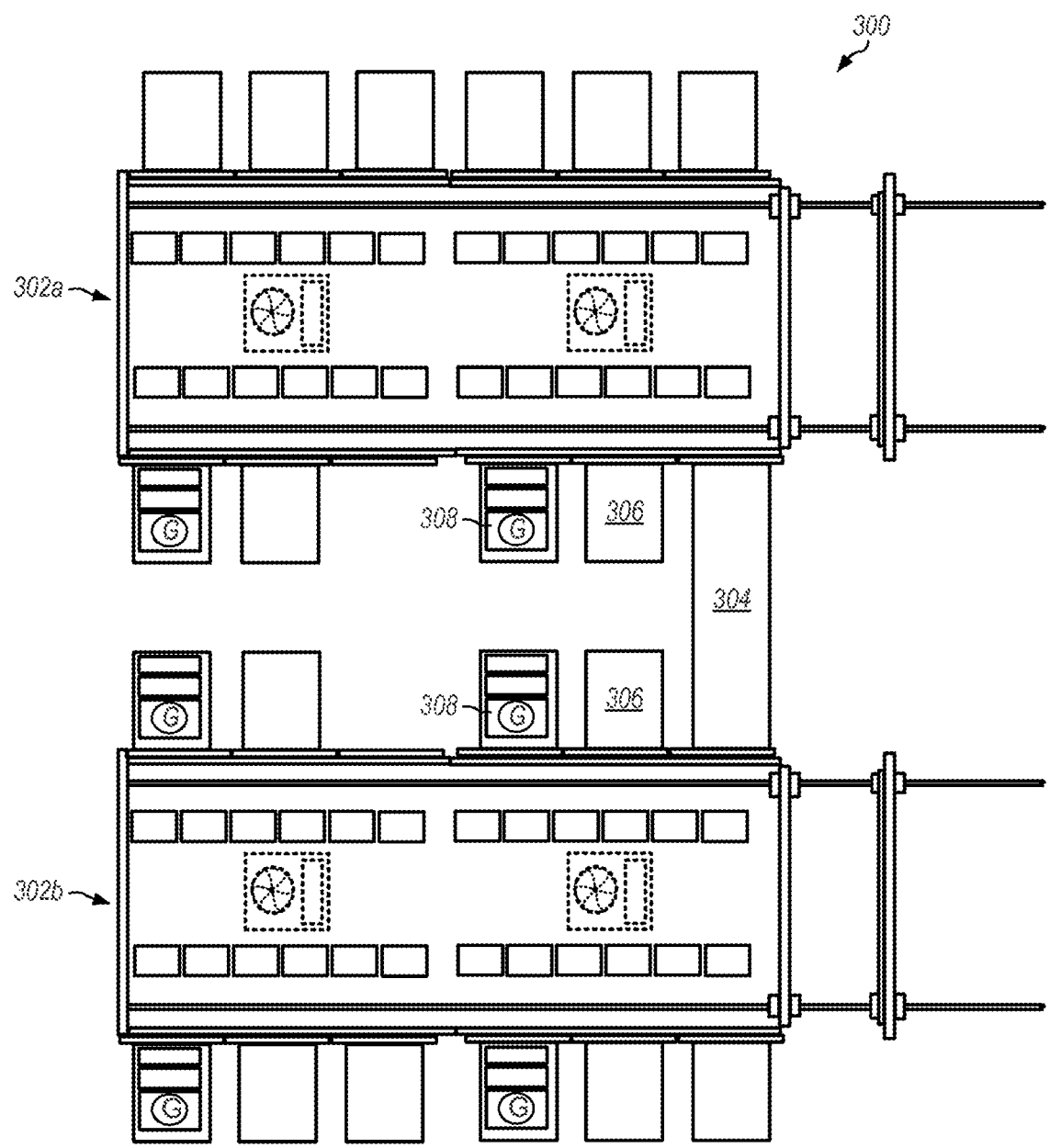
FIG. 11 illustrates a data center having computing rooms connected by common side modules.

In some embodiments, a data center includes side modules that connect two or more computing rooms. FIG. 11 illustrates a data center having computing rooms connected by common side modules. Data center 300 includes computing room 302a, computing room 302b, and side modules 304, 306, and 308. Computing room 302a and computing room 302b may each be expandable as described above. Side module 304 may include an interconnecting hallway that connects computing room 302a and computing room 302b. In some embodiments, side module 306 and 308 provide common data infrastructure for computing devices computing rooms 302a and 302b.

Figure 12:
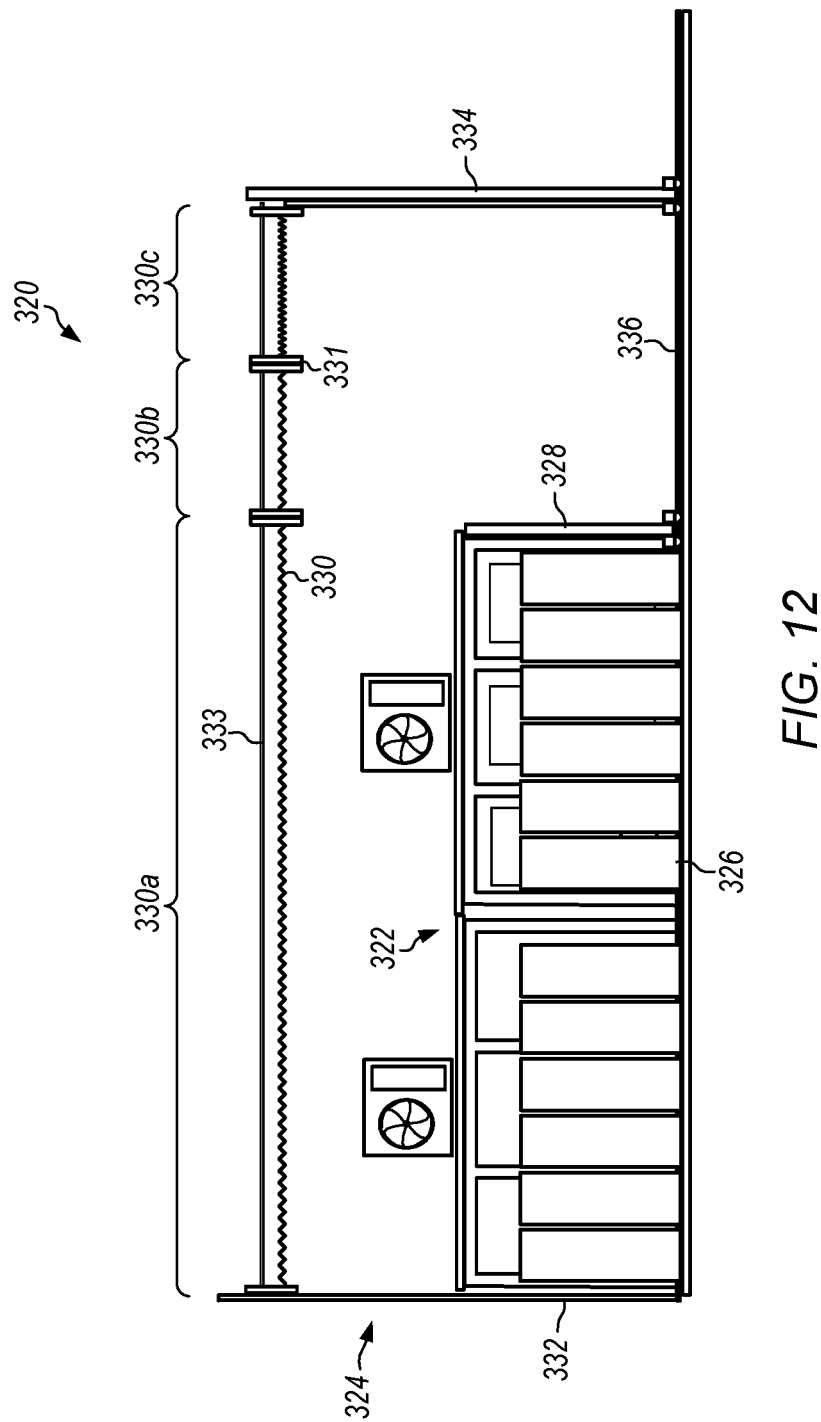
FIG. 12 illustrates a data center having an expandable exterior shell.

In some embodiments, a data center includes an expandable exterior enclosure for housing computing space. FIG. 12 illustrates a data center having an expandable exterior shell. Data center 320 includes computing room 322 and exterior shell 324. Computing room 322 may be similar to computing room 282 described above relative to FIGS. 8A and 8B. Computing room 322 encloses rack computing systems 326. Computing room 322 may be enlarged by moving interior wall 328.

Exterior shell 324 includes canopy 330, end wall 332, and movable exterior wall 334. Movable exterior wall may travel on rails 336. Exterior shell 324 may provide environmental protection for computing room 322 and for the portion of data center 320 outside of computing room 322.

Canopy 330 may have a bellows-type construction. A portion of canopy 330 may cover computing room 332 (for example, section 330a). As additional room is needed to house computing resources, exterior movable wall 334 may be moved out (for example, rolled along rails 336).

In the example shown in FIG. 12, canopy 330 is provided in sections. Sections of canopy may be connected to one another by way of interface plates 331. Interface flanges may include a flange for bolting adjacent sections to on another. Additional sections of canopy may be expanded as the wall is moved out. For example, section 330b may be expanded to create an expansion zone under section 330b. Sections of canopy that are not yet needed may remain in a compressed state, such as section 330c.

Canopy 330 may be supported on guide wire 333. The opposing ends of guide wire 333 may be attached to opposing end walls in the data center. Each of interface plates 331 may be hung on guide wire 333. Guide wire 333 may support canopy 330. For example, guide wire 333 may inhibit sagging of canopy 330 between the opposing end walls of the data center. In some embodiments, canopy 330 is at least partially made out of cloth.

Although in the embodiment shown in FIG. 12, canopy 330 is supported on a guide wire, a cover for an enclosure may be supported by other elements, such as a beams, trusses, rods, joists, or a roof structure. In some embodiments, supporting elements for a cover are provided below the cover. For example, in an alternate embodiment, guide wire 333 may be strung below canopy 330.

Although in the data center shown in FIG. 12, an enclosure may, in other embodiments, include other types of expandable covers. For example, in one embodiment, an exterior enclosure includes a series of nested roof sections connected to movable exterior wall. As additional space is needed in a data center, the exterior movable wall may be moved out to use one or more additional roof sections.

Although in many embodiments described above, movable walls include rollers, a movable wall may in various embodiments not include rollers. In certain embodiments, a movable wall may swing out (for example, on one or more hinges). In some embodiments, two or more movable walls are provided next to another.

Although in many embodiments described above, movable walls move on floor rails, a movable wall may in various embodiments be carried on rails or tracks above the floor, such as overhead rails of side rails. In certain embodiments, a movable end wall for a computing room may not be coupled to any tracks or rails.

Although in many embodiments described above, existing portions of computing space is enlarged by an expansion zone, in certain embodiments, a partition may be maintained between the old computing space and the new computing space in a computing room.

In some embodiments, expansion of one or more computing rooms in a data center may occur in different directions. For example, a computing room may be expanded in two, perpendicular directions (for example, by moving one moving wall to the north and another moving wall to the east.

Although in many embodiments described above, a computing room is protected by a preexisting roof structure, a computing may in various embodiments, have a roof that is constructed as the computing room expanded.

Although in many embodiments described above, a computing room is illustrated as having one movable end wall and one fixed end wall, a data center may in some embodiments, have movable end walls on both ends of a computing room. For example, wall 134 shown in FIG. 1A may be replaced by a movable wall.

Although in many embodiments described above, rollers for a movable wall roll on the floor of a computing room or on floor rails, a movable wall may in some embodiments include rollers that engage structure elements above the floor. For example, a movable wall may include rollers that engage on rails above the floor, such as rails 224 shown in FIGS. 6 and 7. In some embodiments, a movable wall is carried by structural elements above the floor, such as rails 224 shown in FIGS. 6 and 7. In certain embodiments, a movable wall is hung from structural members, such as rails. The movable wall may include hangers (such as hooks), rollers, or both for engaging the structural members. In certain embodiments, a movable wall is carried on side walls a computing room or other structural members along the sides of the wall. In one embodiment, a movable wall includes side-mounted rollers or sliders for engaging a side wall or other structural element provided along the sides of the movable wall.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising: a floor configured to support one or more rack computing systems; an expandable exterior shell, wherein the expandable exterior shell comprises a canopy and at least one moveable exterior wall; and one or more rack computing systems mounted in the data center, wherein the one or more rack computing systems are protected from outdoor environmental conditions by the expandable exterior shell, wherein the floor is configured to support the one or more rack computing systems while the movable exterior wall is being moved to expand the data center; wherein the expandable shell is configured to protect the one or more rack computing systems from the outdoor environmental conditions while the movable wall is being moved to expand the data center, and wherein the canopy and the movable exterior wall of the expandable exterior shell are configured such that one or more sections of the canopy are expanded as the movable exterior wall is moved to expand the data center.

2. The data center of claim 1, wherein the canopy of the expandable exterior shell comprises a bellows-type construction configured to expand such that a size of a computing room of the data center is increased.

3. The data center of claim 1, wherein the canopy comprises a plurality of canopy sections connected on one another via one or more interface flanges, wherein the plurality of canopy sections are configured to couple with one or more additional canopy sections to create an expansion zone for the data center, wherein the one or more additional canopy sections are configured to be expanded as the movable exterior wall is moved to expand the data center.

4. The data center of claim 1, further comprising a guide wire, wherein the canopy of the expandable exterior shell is supported by the guide wire.

5. The data center of claim 1, wherein the expandable exterior shell is expandable in a first direction and is also expandable in a second direction, wherein the first direction and the second direction are different directions.

6. The data center of claim 1, further comprising a computing room, wherein the one or more rack computing systems are mounted in the computing room, and wherein the computing room is partially enclosed by at least one movable interior wall within the expandable exterior shell.

7. The data center of claim 6, further comprising:
a sub-floor space beneath the computing room;
a ground level space bounded by a floor of the computing room and a ceiling of the computing room; and
an additional space between the ceiling of the computer room and the expandable exterior shell.

8. The data center of claim 7, wherein the additional space comprises:
an exhaust plenum configured to discharge air from the computing room to an outside environment, outside of the data center; or
a mixing plenum configured to mix air from the computing room with air from outside the data center.

9. A method of enlarging a data center, comprising:
providing a data center comprising a movable exterior wall, an expandable exterior shell, and one or more rack computing systems mounted in the data center and protected from outdoor environmental conditions by the expandable exterior shell;
moving the exterior wall of the expandable exterior shell of the data center to expand the data center, while the one or more rack computing systems remain protected from the outdoor environmental conditions by the expandable exterior shell; and
expanding a canopy of the expandable exterior shell of the data center to expand the data center, while the one or more rack computing systems remain protected from the outdoor environmental conditions by the expandable exterior shell, wherein one or more sections of the canopy are expanded as the movable exterior wall is moved to expand the data center.

10. The method of claim 9, further comprising;
moving an interior wall of a computing room of the data center into an expansion zone of the data center created by moving the exterior wall of the expandable exterior shell; and
mounting one or more additional rack computing systems in a space added to the computing room by moving the interior wall of the computing room into the expansion zone of the data center.

11. The method of claim 10, further comprising:
coupling side modules on opposing sides of the expansion zone to enclose the space added to the computing room by moving the interior wall.

12. The method of claim 11, wherein the side modules provide:
electrical power support;
network support; or
cooling support, for the additional rack computing systems.

13. The method of claim 9, further comprising:
installing, prior to moving the exterior wall, an additional floor section adjacent to the data center, wherein moving the exterior wall comprises moving the exterior wall such that the data center is expanded to include at least a portion of the additional floor section.

14. The method of claim 9, wherein expanding the canopy of the expandable exterior shell comprises:
installing an additional canopy section; and
coupling the additional canopy section to an installed canopy section.

15. The method of claim 12, wherein coupling the additional canopy section to the installed canopy section comprises:
coupling the additional canopy section to a guide wire of the data center; and
coupling an interface flange of the additional canopy section to an interface flange of the installed canopy section.

16. A method of enlarging a computing room of a data center, the method comprising:
installing an additional canopy section in an expandable exterior shell of the data center;
moving an exterior wall of the expandable exterior shell to create an expansion zone of the data center, wherein the additional canopy section is expanded as the exterior wall is moved to create the expansion zone;
moving an interior wall of the computing room into the expansion zone of the data center created by the exterior wall of the expandable exterior shell of the data center being moved, wherein one or more rack computing systems are mounted in the computing room when the exterior wall and the interior wall are moved; and
mounting one or more additional rack computing systems in a space added to the computing room by moving the interior wall of the computing room into the expansion zone.

17. The method of claim 16, further comprising
coupling the additional canopy section to an installed canopy section.

18. The method of claim 16, further comprising:
moving another interior wall of the computing room into another expansion zone of the data center created by another exterior wall of the expandable exterior shell of the data center being moved; and
mounting one or more additional rack computing systems in another space added to the computing room by moving the other interior wall of the computing room into the other expansion zone.

19. The method of claim 16, further comprising:
coupling side modules on opposing sides of the expansion zone to enclose the space added to the computing room by moving the interior wall.

* * * * *